(12) United States Patent
Yu

(10) Patent No.: US 6,193,553 B1
(45) Date of Patent: Feb. 27, 2001

(54) ELECTRICAL CARD CONNECTOR

(75) Inventor: Hung-Chi Yu, Hsi-Chih (TW)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 0 days.

(21) Appl. No.: 09/304,211

(22) Filed: Apr. 29, 1999

(30) Foreign Application Priority Data

Dec. 18, 1998 (TW) .................................................. 87221148

(51) Int. Cl.[7] .................................................. H01R 13/648
(52) U.S. Cl. .................................................. 439/607
(58) Field of Search .............................. 439/64, 571, 573, 439/607

(56) References Cited

U.S. PATENT DOCUMENTS

| | | | |
|---|---|---|---|
| 5,249,983 | * | 10/1993 | Hirai ..................................... 439/573 |
| 5,288,244 | * | 2/1994 | Lien ...................................... 439/362 |
| 5,525,064 | * | 6/1996 | Mowry ................................... 439/66 |
| 5,613,860 | * | 3/1997 | Banakis et al. ......................... 439/64 |
| 5,738,541 | * | 4/1998 | Tseng .................................... 439/567 |
| 5,822,193 | * | 10/1998 | Summers et al. ..................... 361/759 |
| 6,027,372 | * | 2/2000 | Lai et al. ............................. 439/573 |
| 6,030,251 | * | 2/2000 | Stark et al. .......................... 439/337 |
| 6,050,852 | * | 4/2000 | Wu ...................................... 439/607 |

* cited by examiner

Primary Examiner—Brian Sircus
Assistant Examiner—Thanh-Tam Le
(74) Attorney, Agent, or Firm—Wei Te Chung

(57) ABSTRACT

An electrical card connector assembly includes an insulative body, a plurality of terminals received in the body, a shield attached to the body, a card ejection mechanism disposed on one longitudinal side of the body, and a bolt and a nut for fastening the components of the connector together. A fastening portion with protrusion structures formed thereon extends from one longitudinal side of the shield and the nut is positioned in the fastening portion thereby preventing the nut from moving along the axial direction of the corresponding bolt. Thus, extra retention is unnecessary when engaging the bolt with the nut thereby simplifying and expediting assembly of the connector.

4 Claims, 5 Drawing Sheets

ELECTRICAL CARD CONNECTOR

BACKGROUND OF THE INVENTION

The present invention relates to an electrical card connector, and particularly to an electrical card connector with a shield which can be rapidly assembled to an insulative body thereby simplifying and expediting assembly.

DESCRIPTION OF PRIOR ART

Generally speaking, most electrical cards and electrical card connectors conform to the standards of PCMCIA (Personal Computer Memory Card International Association). However, as both the capacity and speed of communication transmission increase, the disturbance of miscellaneous electrical messages becomes increasingly serious thereby adversely affecting the quality of signal communication. To overcome the above-mentioned deficiency, a shield for shielding miscellaneous electrical messages is commonly assembled to the electrical card connector for ensuring the quality of signal communication. Taiwan Patent Application No. 86210606 and U.S. Pat. No. 5,662,482 describe such connectors.

Referring to FIGS. 5 and 6, an existing shield 80 is assembled to an electrical connector by a clip 81. In assembly, the shield 80 is placed on an insulative body 82 and a guide frame 83, and the clip 81 is aligned with a hole 831 and a nut 84 from one side of the shield 80. A bolt 85 is inserted into the hole 831 from an opposite side whereby one hand is required to stabilize the nut 84 while the other hand rotates the bolt 85 for fastening the components together. While engaging the nut 84 with the bolt 85, the clip 81 is planar and can not prevent the nut 84 from moving along the axial direction of the bolt, thus the nut 84 may be displaced by the bolt 85 during assembly. Therefore, one hand must hold the nut 84 while the other hand rotates the bolt 85, which is inconvenient and time inefficient. Furthermore, one surface of the nut 84 must face upward or the nut 84 may become displaced from the hole 831 thereby requiring re-assembly, which prolongs assembly time and reduces manufacturing efficiency.

To avoid the aforesaid deficiencies, the hole 831 can be designed to be slightly smaller than the nut 84 thereby requiring a high degree of manufacturing precision. In assembly, both the nut 84 and the clip 81 are retained in the hole 831 with a suitable tool. The aforementioned feature increases manufacturing costs because of high precision requirements resulted from creating the hole 831 and the specific tools.

SUMMARY OF THE INVENTION

A main object of the present invention is to provide an electrical card connector having a shield which can be rapidly assembled to an insulative body thereby simplifying and expediting assembly of the connector.

In order to achieve the object set forth, an electrical card connector assembly in accordance with the present invention includes an insulative body, a plurality of terminals received in the body, a shield attached to the body, a card ejection mechanism disposed on one longitudinal side of the body, and a bolt and a nut. A fastening portion extends from a longitudinal side of the shield. The fastening portion is shaped after several bends for receiving a retentive nut therein. During the bending process of the fastening portion, a first side plate, a base plate and a second side plate are formed outward in turn, wherein the first side plate faces the second side plate. Protrusion structures are formed on both of the first and the second side plates projecting toward the nut at a height equal to or slightly larger than that of the nut thereby preventing the nut from moving along the axial direction of the bolt. Thus, the shield can be easily connected to the insulative body by a bolt and a nut without requiring extra retention thereby simplifying and expediting assembly of the connector.

Other objects, advantages and novel features of the invention will become more apparent from the following detailed description when taken in conjunction with the accompanying drawings.

DETAILED DESCRIPTION OF THE PREFERRED EMBODIMENT

Figure 1:
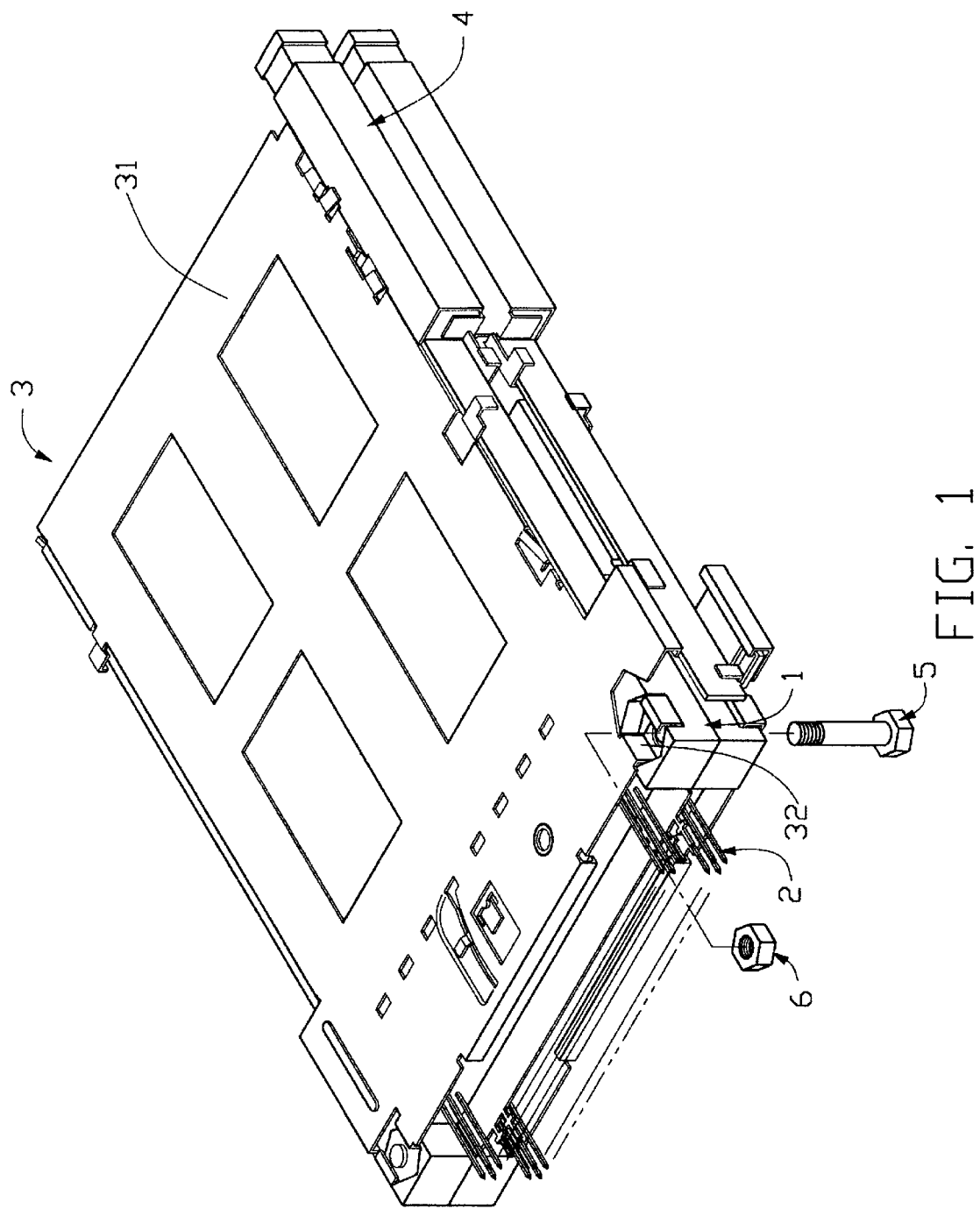
FIG. 1 is a perspective view of an electrical card connector in accordance with a first embodiment of the present invention.
Figure 2:
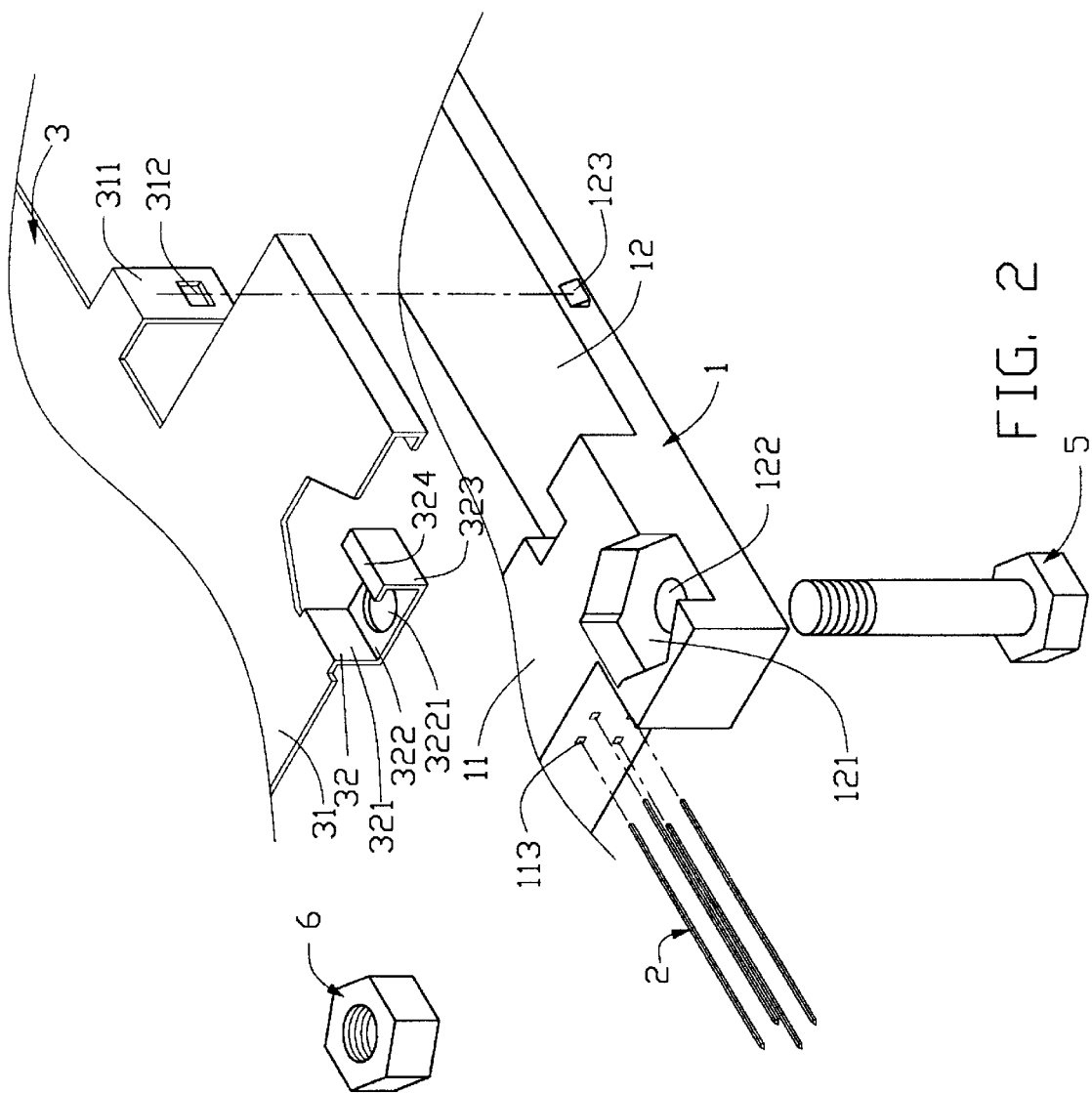
FIG. 2 is a partial enlarged view of FIG. 1.

It will be noted here that for facilitating understanding, most of like components are designated by like reference numerals throughout the various embodiments as shown in the attached drawing figures. Referring to FIGS. 1 and 2, an electrical card connector assembly includes an insulative body 1, a plurality of terminals 2, a shield 3, a card ejection mechanism 4, a bolt 5 and a nut 6. The body 1 has a U-shaped frame including an elongate terminal-receiving portion 11 and a pair of arms 12 extending from opposite ends of the terminal-receiving portion 11. A plurality of passageways 113 extends through opposite sides of the terminal-receiving portion 11 for receiving the terminals 2 therein. A hexagonal cavity 121 corresponding to the configuration of the nut 6 is defined in a top surface of each arm 12 adjacent to the terminal-receiving portion 11 for receiving the retentive nut 6. A bore 122 is further defined through the arm 12 in communication with the cavity 121 whereby an opening of the bore 122 is exposed to a central portion of the cavity 121. A wedge-shaped locking cam 123 is formed on an outer surface of each arm 12.

The shield 3 for covering the body 1 includes a shielding plate 31 and a fastening portion 32, wherein the shielding plate 31 covers a surface of the body 1 thereby providing the electrical card connector with electrical shielding capabilities. The fastening portion 32 is formed on one longitudinal side of the shielding plate 31 proximate an end thereof. The card ejection mechanism 4 is mounted on one longitudinal side of the shield 3. The bolt 5 and the nut 6 are respectively received in the bore 122 of the body 1 and the fastening portion 32 of the shield 3 to integrally connect the shield 3 and the body 1 after being threadedly engaged with each other.

The fastening portion 32 outwardly extends from the longitudinal side of the shield 3. The fastening portion 32 is composed of a first side plate 321, a base plate 322 and a second side plate 323. The first side plate 321 is shaped by vertically bending the fastening portion 32 with respect to the shield 3. The base plate 322 is shaped by horizontally bending the first side plate 321, and the second side plate 323 is shaped by bending the base plate 322 in a direction opposite the first side plate 321. The second side plate 323 is then bent in the direction toward the shield 3 thereby forming a blocking plate 324 which is parallel to the base plate 322 whereby the space defined therebetween has a dimension equal to or slightly larger than the thickness of the nut 6. The first side plate 321 and the second side plate 323 are parallel to each other whereby the space defined therebetween is equal to or slightly larger than the length of the nut 6 between two parallel side surfaces thereof. An aperture 3221 is defined through the center of the base plate 322 for extension of the bolt 5 therethrough. Furthermore, a hook 311 is formed on one longitudinal side of the shielding plate 31 at the position corresponding to the cam 123 of the body 1 with a fastening hole 312 defined therethrough.

The shield 3 is connected to the body 1 and fastened by the bolt 5 and the nut 6 by the process described hereinafter. The nut 6 is horizontally positioned on the base plate 322. The shield 3 is positioned on the body 1 whereby the fastening hole 312 of the hook 311 engages with the cam 123 of the body 1 and the fastening portion 32 is received in the cavity 121 of the body 1. The bolt 5 extends through the bore 122 of the body 1 and the aperture 3221 of the fastening portion 32 to threadedly engage with the nut 6.

During the process of engagement between the bolt 5 and the nut 6, although the pressing force exerted from the bolt 5 acts on the nut 6, the nut 6 will not be displaced along the direction of the bolt 5 due to the restriction provided by the blocking plate 324. Since the shield 3 is connected to the body 1 by means of an engagement between the hook 311 and the cam 123, the shield 3 will not disengage from the body 1 when threading the bolt 5 with the nut 6. The nut 6 is further restricted by the cavity 121 after the fastening portion 32 with the nut 6 received therein is positioned in the cavity 121 whereby the nut 6 can not move in any direction thereby simplifying and expediting assembly of the electrical connector.

Figure 3:
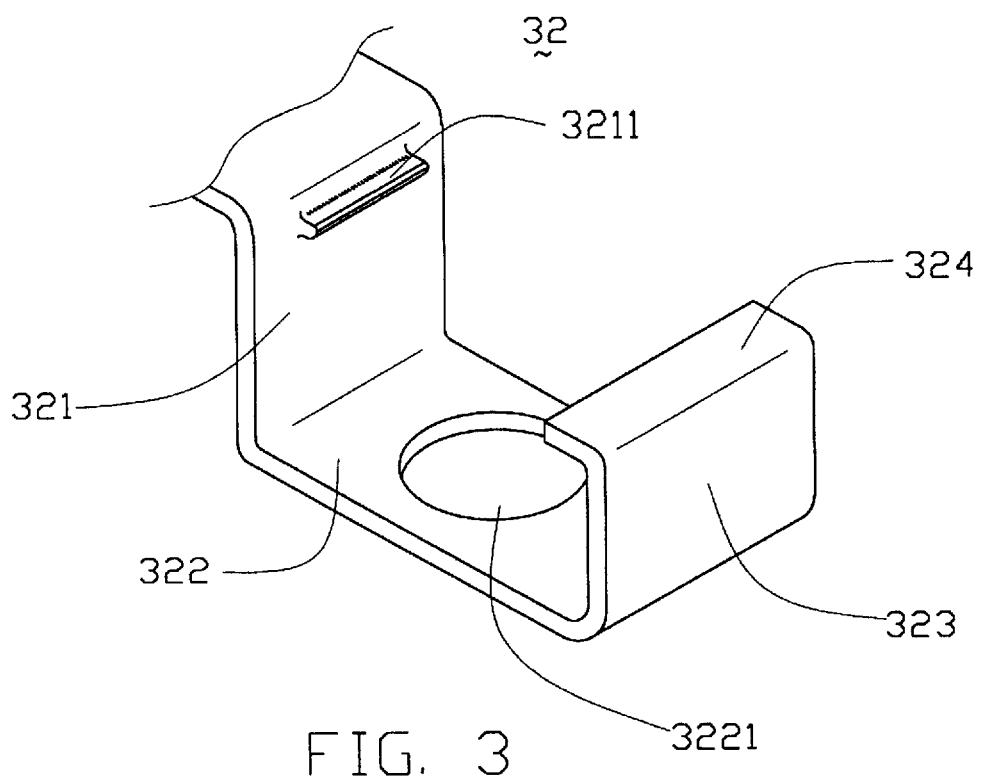
FIG. 3 is a partial enlarged perspective view of a fastening portion in accordance with a second embodiment of the present invention.

Referring to FIG. 3, a second embodiment of the fastening portion 32 formed on the shield 3 is shown. A rib 3211 protruding a predetermined distance toward the blocking plate 324 is formed on the first side plate 321 of the fastening portion 32 at substantially the same level as the blocking plate 324. The rib 3211 can further prevent the nut 6 from moving along the axial direction of the bolt 5 and achieve an excellent retentive effect together with the blocking plate 324.

Figure 4:
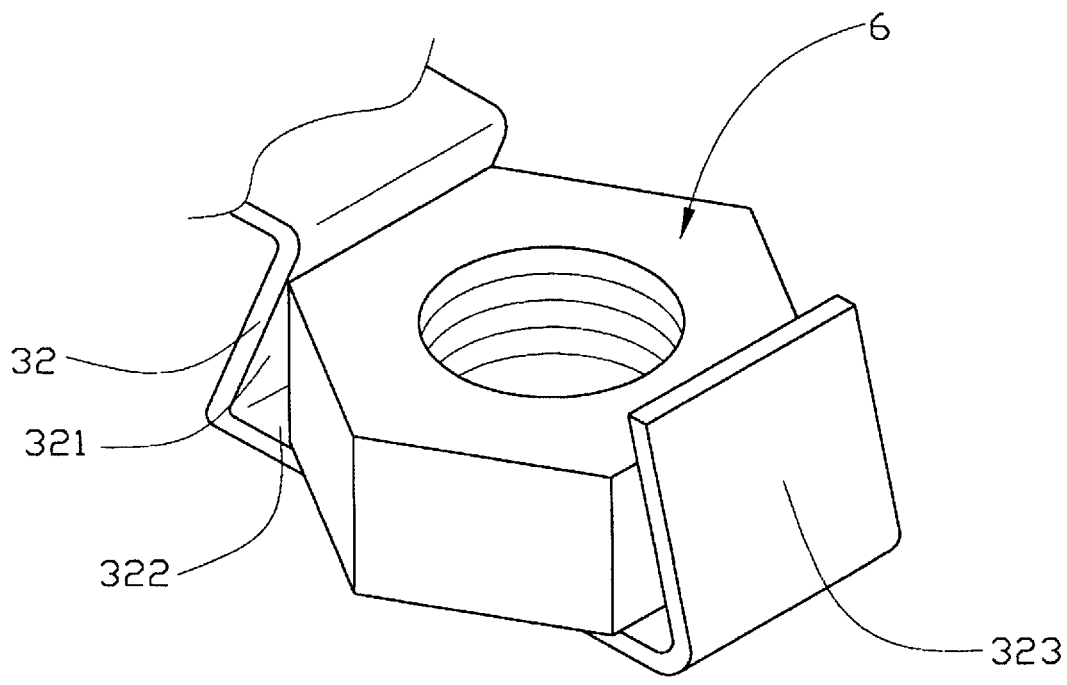
FIG. 4 is a partial enlarged perspective view of a fastening portion in accordance with a third embodiment of the present invention.
Figure 5:
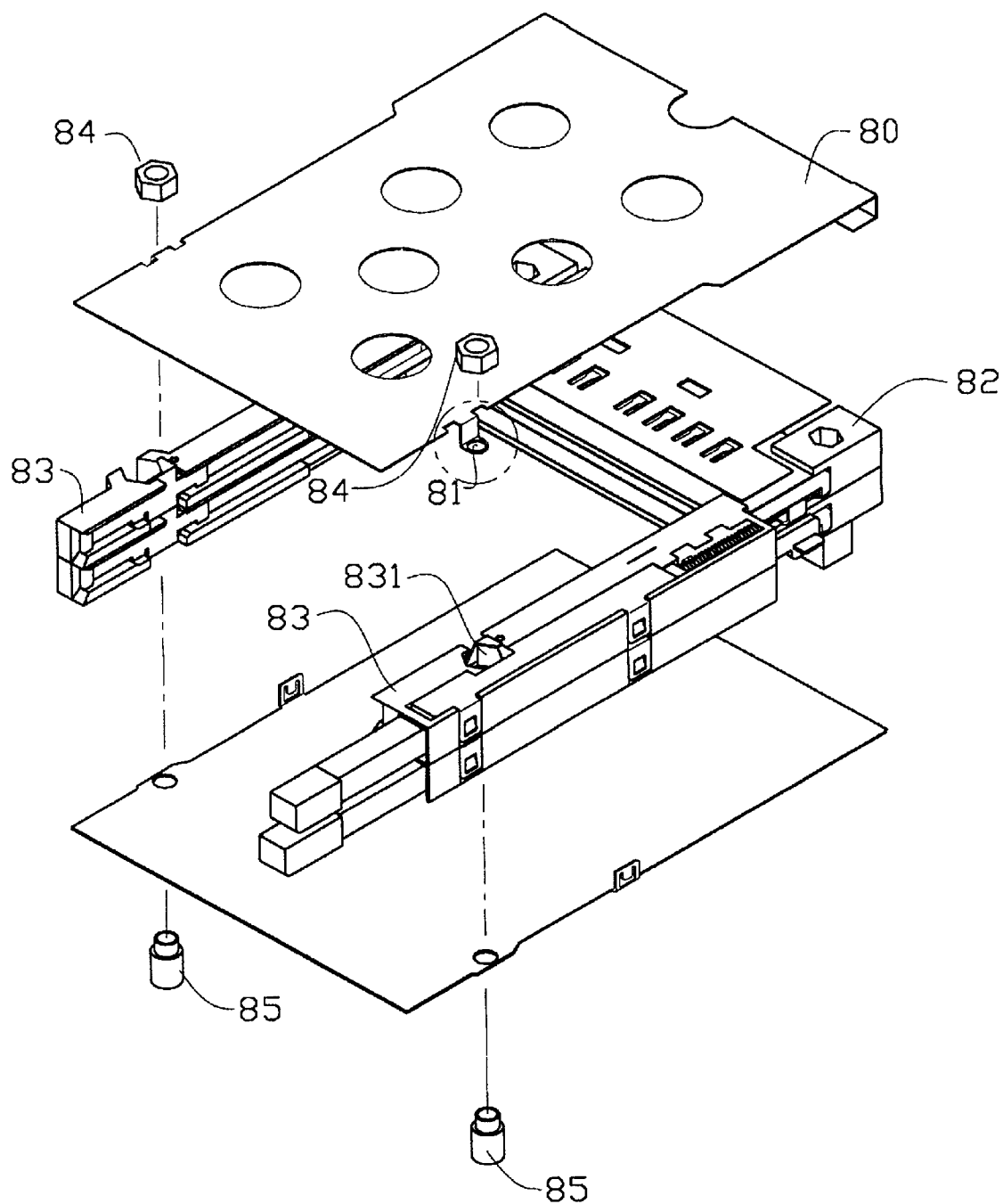
FIG. 5 is a partial exploded view of a prior art electrical card connector.
Figure 6:
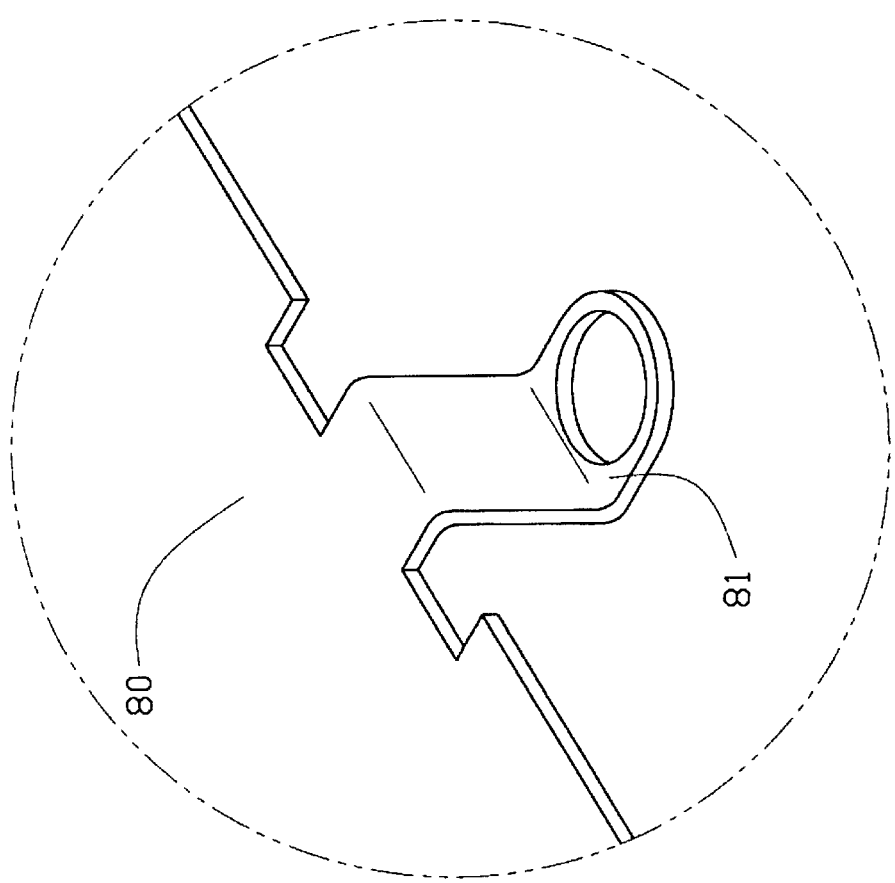
FIG. 6 is a partial enlarged view of FIG. 5.

A third embodiment of the fastening portion 32 formed on the shield 3 is shown in FIG. 4, wherein the first side plate 321 is not parallel to the second side plate 323. When the nut 6 is horizontally positioned on the base plate 322, the nut 6 will be retentively sandwiched between the first side plate 321 and the second side plate 323 thereby being prevented from moving along the axial direction of the bolt 5.

It can be understood that before incorporating the bolt 5, the nut 6 is restrained by the cavity 121 of the body 1 horizontally while by the fastening portion 32 of the shield 3 vertically wherein the fastening portion 32 is generally received within the cavity 121.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. An electrical card connector comprising:

an insulative body having a terminal-mounting portion and a cavity;

a shielding housing having a fastening portion extending from one longitudinal side thereof and received in the cavity of the body; and a combination of a bolt and a nut for fixedly attaching the shielding portion to the insulative body, the nut being immovably received in the cavity by the fastening portion, and the bolt extending through the cavity, the fastening portion and the nut; wherein the fastening portion of the shielding housing comprises a first side plate, a base plate and a second side plate, the first side plate being shaped by bending the fastening portion in a direction away from the plane of the shielding housing, and the base plate being shaped by bending the first side plate along the same direction as the plane of the shielding housing, and the second side plate being shaped by bending the base plate in a direction opposite the first side plate.

2. The electrical card connector as described in claim 1, wherein a blocking plate preventing the nut from moving along an axial direction of the bolt is formed on the second side plate of the fastening portion, the blocking plate extending from the second side plate toward the first side plate at a position slightly larger than the height of the nut.

3. The electrical card connector as described in claim 1, wherein a rib for preventing the nut from moving along the axial direction of the bolt is formed on the first side plate of the fastening portion, the rib extending from the first side plate toward the second side plate at a position slightly larger than the height of the nut.

4. The electrical card connector as described in claim 1, wherein the first and second side plates of the fastening portion are angled toward each other relative to the base plate, the nut being retentively sandwiched between the first and the second side plates to prevent the nut from moving along the axial direction of the bolt.

* * * * *